May 3, 1966 B. R. HALPERN 3,249,436

PROCESS FOR PREPARING PRINTING PLATES FROM PHOTOPOLYMERIZABLE MATERIALS BY THE USE OF A MASKING TECHNIQUE

Filed June 29, 1960 3 Sheets-Sheet 1

INVENTOR
BERNARD ROBERT HALPERN

BY Weston B. Wardell Jr.

ATTORNEY

INVENTOR
BERNARD ROBERT HALPERN

BY *Weston B. Wardell Jr.*

ATTORNEY

May 3, 1966 B. R. HALPERN 3,249,436

PROCESS FOR PREPARING PRINTING PLATES FROM PHOTOPOLYMERIZABLE MATERIALS BY THE USE OF A MASKING TECHNIQUE

Filed June 29, 1960 3 Sheets-Sheet 3

INVENTOR

BERNARD ROBERT HALPERN

BY Weston B. Wardell Jr.

ATTORNEY 3,249,436
Patented May 3, 1966

3,249,436

PROCESS FOR PREPARING PRINTING PLATES FROM PHOTOPOLYMERIZABLE MATERIALS BY THE USE OF A MASKING TECHNIQUE

Bernard Robert Halpern, Swarthmore, Pa., assignor to E. I. du Pont de Nemours and Company, Wilmington, Del., a corporation of Delaware Filed June 29, 1960, Ser. No. 39,487
7 Claims. (Cl. 96—44)

Figure 1:
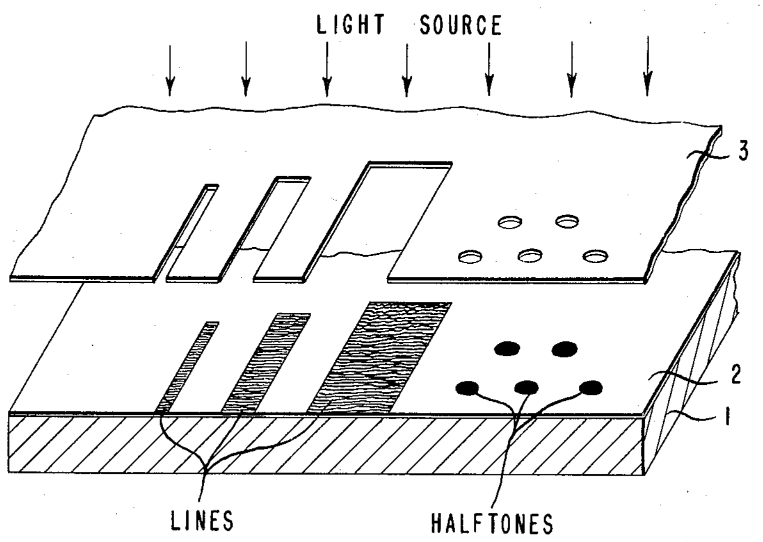

This invention relates to the graphic arts field and more particularly it relates to photomechanical processes for the preparation of printing plates in the graphic arts field. The invention further relates to processes for the preparation of relief images suitable for use as printing plates. The invention is particularly directed to improvements in processes for exposing photopolymerizable elements which are used as printing plates.

Printing is a very old and well established, though very complex, art. The complexity is multiplied when the art of photography is applied to the preparation of printing plates.

In the normal prepartion of photomechanical printing plates, such as in photoengraving or in photolithography, there is utilized a supporting material which is ultimately used as the printing plate and is usually metal coated with a thin light-sensitive emulsion. This emulsion may be a bichromated water-permeable colloid, e.g., albumin, glue, casein, polyvinyl alcohol, gelatin, or a silver halide emulsion. Exposure of this sensitive layer to radiation through a line or halftone image transparency insolubilizes the exposed areas, so that upon development by either washing in warm water as in the case of the bichromated colloid emulsions or photographic developing and warm water washing as in the case of the silver halide emulsions, these areas will serve as a resist for the etching step which forms a printing image in the metal plate in proportion to the tonal linearity of the image. The thin emulsions which are used to sensitize the metal plates may be considered as two dimensional in nature, and printing elements of any size, ranging from a fine highlight dot to a large solid area, will require the same exposure to light to insolubilize the emulsions. In other words, the relative size of printing detail does not influence the extent of exposure. It is well recognized that the preparation of plates in this manner is tedious and unreliable. Generally the etching operation must be done in a series of steps to avoid undercutting of the printing image. Even with great care, plates are not always satisfactory and require a considerable amount of tedious handwork to obtain a printing plate that will give satisfactory reproductions of the original.

A new development in the art provides a photopolymerizable element which may be exposed through a line or halftone image transparency and processed to give a printing plate directly without resorting to the prior art metal etching steps. Such elements are described in Plambeck U.S. Patents 2,760,863 and 2,791,504; Martin U.S. Patents 2,892,716, 2,927,023 and 2,929,710; Martin et al. U.S. Patent 2,927,022; and Munger U.S. Patent 2,923,673 and also Burg U.S. application Ser. No. 750,868 filed July 25, 1958 now U.S. Patent 3,036,913. Printing plates composed of said photopolymerizable layers are easy to make and more faithfully reproduce the subject matter to be printed from the negative to which the plate is photographically exposed than the plates of the prior art. Such photopolymerizable layers are generally of the order of 10 to 60 mils in thickness and may be considered as three-dimensional forms as compared to the two-dimensional, light-sensitive layers of the prior art described above. In the photopolymerizable element, the light-sensitivity necessary for photographically transferring the image from the negative and the relief form necessary for printing are combined in one element. In such photopolymerizable elements, the entire relief image is, and, must be formed in depth or throughout the thickness of the photopolymerizable layer by the action of the exposure light. All unexposed polymerizable material is removed by washing out by some suitable media such as organic solvents or mild aqueous alkali solutions. The extent to which photopolymerization will take place through the thickness of the element is a function of the size of the printing detail. In this case, as opposed to exposing a thin two-dimensional layer, the relative size of the printing detail does influence the extent of exposure through the thickness of the material. This is due, in part, to absorption and to dispersion of the exposure radiation in passing through and converting the photopolymerizable material to a polymerized relief.

An object of this invention is to provide an improved process for preparing photopolymerized printing elements. Another object is to provide such a process wherein the relief image is formed throughout the relief height forming stratum of the photopolymerized layer. Still another object is to provide such a process wherein the relief image areas of the photopolymerized element receive an adjusted amount of actinic radiation to provide optimum printing structures. Yet another object is to provide a process wherein fine details of the photopolymerized element are not lost during the washout of the unexposed areas. A further object is to provide such a process wherein the photopolymerized printing elements will reproduce fine detail in the middletones and shadows after prolonged wear. Still further objects will be apparent from the following description.

The above objects are attained by a novel process for preparing a printing relief from a photopolymerizable element comprising a support bearing a solid layer of a photopolymerizable composition comprising (1) a preformed, compatible, macromolecular polymer binding agent, (2) a non-gaseous, addition-polymerizable ethylenically-unsaturated compound containing at least one, e.g., one to four, terminal ethylenic groups capable of forming a high polymer by photo-initiated addition polymerization in the presence of an addition polymerization initiator therefore activatable by actinic radiation and (3) from 0.0001 to 10 percent and more by weight of the layer of such an initiator which is inactive thermally below 85° C., including exposing imagewise to actinic radiation through a negative having fine detail image areas and large detail image areas and subsequently removing the unexposed portions of said photopolymerizable layer with a solvent for said binding agent, the improvement characterized by having in register with said negative during said exposure a photographic masking layer capable of modulating the exposure of image areas similar to those in the negative, the masking layer being essentially clear and transparent in the fine detail image areas and having increasing density in image areas ranging from the fine detail image areas to the large detail image areas.

The extent of the increased density of the above-described photographic masking layer is directly related to the amount of transmitted radiation required to produce the optimum polymerization behind each size of printing detail or relief, i.e., fine detail areas, e.g., highlights and fine lines; middle tones; large areas, e.g., shadow dots and bold strokes, of the image-bearing negative. The range of density of the photographic masking layer is generally not greater than 1.0 more than the areas of lowest density, and preferably not greater than 0.6. For example, the density of the masking layer in the highlight and fine areas may be about 0.05 or 0.06. The density in the shadow and bold stroke areas therefore will generally not be greater than 1.05 or 1.06. The maximum density of the layer in the shadow and bold stroke image areas can be as high as about 1.3 with the density in the fine detail areas adjusted accordingly.

The photographic masking layer can also be modified in tonal range and tonal linearity to favor any selected printing values during the exposure of the photopolymerizable element. The masking layer, of course, may be limited to specific areas, e.g., halftone areas only, line areas only or a combination of both line and half-tone detail.

The thickness of the photopolymerizable layers which can be modified by this invention can range from 3 to 250 mils. Preferably the thickness of the layer ranges from 10 to 60 mils, the thickness used for a majority of letterpress printing plates.

Figure 2:
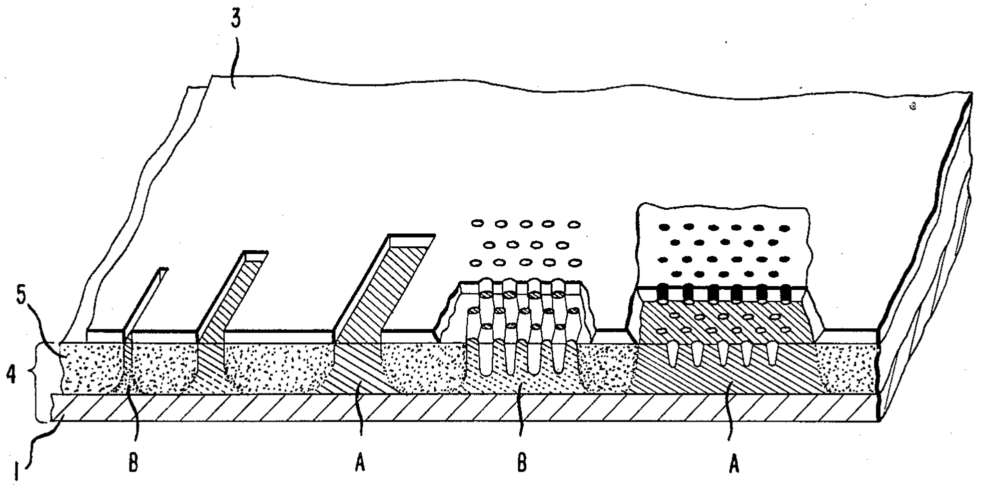
Figure 3A:
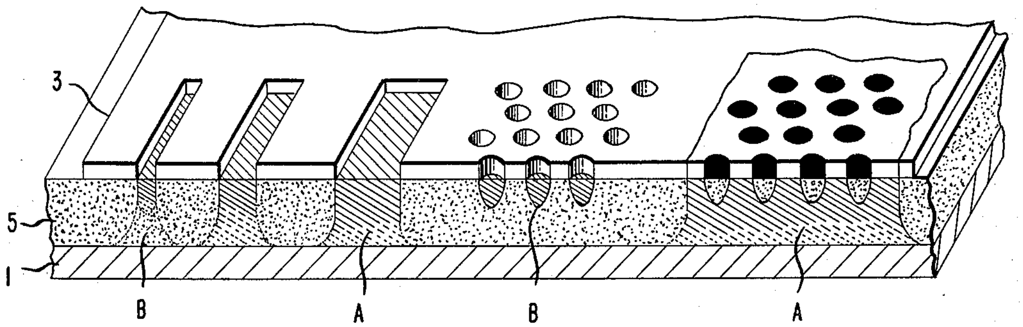
Figure 3B:
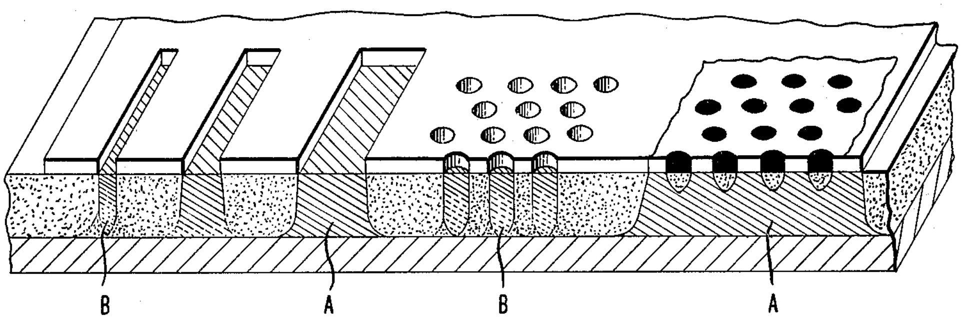
Figure 3C:
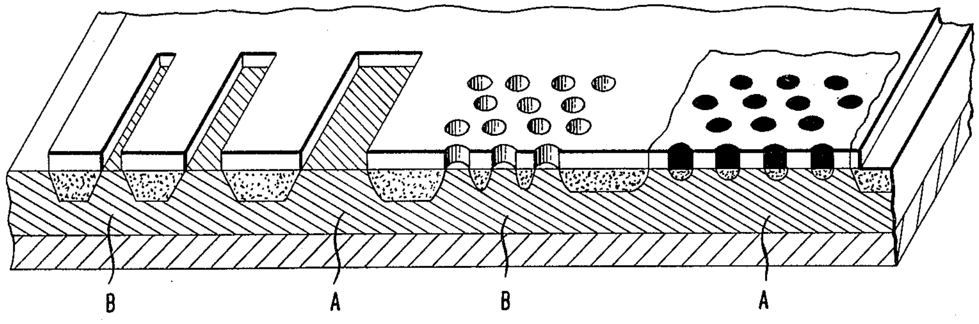
Figure 4:
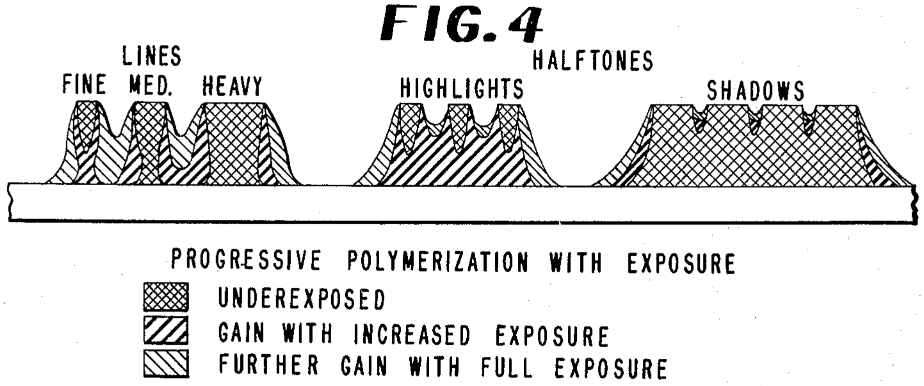
Figures 6, 7:
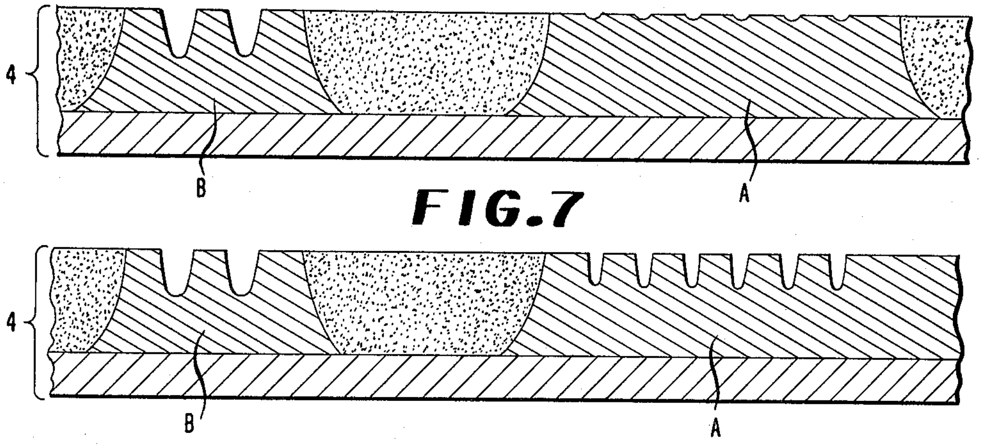
Figure 5:
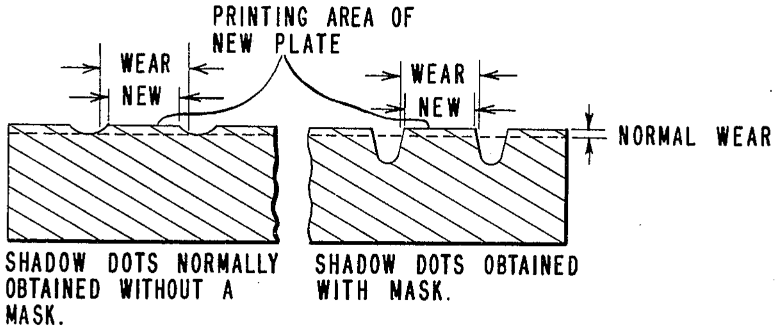

The invention will be understood more readily and distinguished from the problems of the prior art by reference to the accompanying drawings. In the attached drawings which form a part of this specification:

FIG. 1 is a perspective view partially in section of a standard photoengraving or lithographic element and a negative shown schematically in section, the negative showing various types of printing detail, FIG. 2 is a perspective view partially in section of a photopolymerizable element and a contacting negative shown schematically in section, the negative showing various types of printing detail, FIG. 3 is a perspective view partially in section of a photopolymerizable element and a contacting negative shown schematically in section during short, medium and full exposure, FIG. 4 is an exaggerated elevation in section of line and halftone printing characters shown progressively underexposed, upon increased exposure and fully exposed, FIG. 5 is an enlarged elevational view showing the wear characteristics of shadow printing detail exposed with and without the use of a photographic masking layer, FIG. 6 is an elevational view in section of a photopolymerizable element showing shadow areas and halftones exposed without the use of a photographic masking layer, FIG. 7 is an elevational view in section of a photopolymerizable element showing shadow areas and halftones exposed with the use of a photographic masking layer.

With reference now to FIG. 1, a standard photoengraving or lithographic element comprising a base support 1 on which is coated a thin light-sensitive emulsion coating 2, e.g., a bichromated colloid emulsion or a silver halide emulsion, is exposed (light source not shown) through a photographic negative 3 to form an image on the light-sensitive surface. The negative 3 is shown schematically in section and separated from the element to more clearly illustrate examples of some of the printing detail which can be formed on the light-sensitive coating 2, e.g., line and halftone detail.

FIG. 2 is similar to FIG. 1 but illustrates a prior art photopolymerizable element. The photopolymerizable element 4 comprises a base support 1, which can be metal or suitable plastic, bearing a layer of a photopolymerizable composition 5, the thickness of the photopolymerizable layer 5 ranging from 3 to 250 mils. A photographic negative 3 is placed on photopolymerizable layer 5 during exposure to form printing characters similar to those illustrated in the figure. The negative 3 is illustrated schematically in section to show the exposure areas more clearly. Those represented by letter A are the bold type areas and halftone shadow areas while those represented by letter B are the fine detail image areas and highlight halftone dots. The bold type and halftone shadow areas A will polymerize rapidly through the thickness of the photopolymerizable layer 5 when exposed to actinic radiation (source not shown). The reason for this is that the total percentage of actinic radiation penetrating through the exposure areas of the negative 3 is relatively large in relation to the thickness of the photopolymerizable layer 5 as compared with the core isolated areas of fine printing detail and highlight halftone dots B. For the fine printing detail and highlight halftone dots B, the total percentage of radiation received by the areas is relatively small in relation to the thickness of the photopolymerizable layer 5. Since the radiation also loses intensity due to absorption and scattering within the thickness of the photopolymerizable layer 5, there is considerably less exposure toward the bottom of the layer 5 than at the top. As a result, upon the removal of unpolymerized portions of the photopolymerizable layer 5, fine lines and highlight halftone dots B may be lost.

In order to completely polymerize the three-dimensional photopolymerizable material behind the finer image areas of a negative, such as the hairline strokes in the text characters and highlight dots in the halftones, it is necessary to increase the exposure progressively as the detail becomes finer in its dimensions. FIG. 3 illustrates the relation of exposure time to the degree of polymerization of a photopolymerizable layer 5 as a function of the size of printing detail of the negative 3. It shows how short exposure FIG. 3A, is insufficient to completely polymerize fine detail and highlight halftone dots B through the thickness of the layer and yet it may be adequate for bold type (heavy line) and shadow halftone areas A. Inasmuch as a common exposure to radiation in plate-making is normally made through a negative 3, it is necessary to increase the exposure time (see FIGS. 3B and 3C) to an amount sufficient to expose the finest printing detail that is to be reproduced. Consequently, the bolder printing detail in the text matter and the middletones and shadows of the halftone are overexposed, and the relief or dot depth in these areas is reduced. Increased exposure also broadens the angle of the polymerized printing character incident to the printing surface as shown in FIG. 4 in which the characters are enlarged. This causes filling in with ink during printing, and shortens the useful wear life of the plate due to a rapid increase in printing area with plate wear as shown by FIG. 5.

FIG. 6 illustrates exposing a photpolymerizable element 4 through a photographic negative and FIG. 7 illustrates exposing such element by modifying the radiation passing through the negative by means of a photographic masking layer so that the layer is photopolymerized to the correct degree in all areas. The masking layer permits retention of dot reliefs in the highlight area B as is normally obtained without a mask, and permits increased relief height of the dots in the middletones (not shown) and shadows A. This is the equivalent of using a short exposure for shadow detail A as shown in FIG. 3A, and a full exposure for highlight detail B as shown in FIG. 3C.

The preparation of the masks will now be described in more detail. To determine the density range of the mask and the specific density values required for each proportional integrated exposure percentage along the tone scale or detail size, a series of plate exposures is made with a control negative. Increasing exposure times in this series will result in progressively finer detail being adequately polymerized to a point where the finest lines and the smallest halftone dots are retained during the wash-out processing of the exposed photopolymerized plate. This is graphically illustrated in the fully exposed structure of FIG. 3C. The exposure times are then plotted as a function of detail size. Since the reciprocity of exposure time and light intensity are approximately constant in the exposure range used, the decreasing exposure times required for adequate photopolymerization from highlights to shadows can be converted to density values in a photographic masking layer designed to modulate the correct proportion of light to be transmitted. This is illustrated by the following table from a 120 line halftone screen.

| Percent dot[1] + | Minimum exposure time to produce printing dot, minutes | Equivalent percent of exposure | Corresponding increased density needed for equivalent exposure |
|---|---|---|---|
| Highlight: | | | |
| 10 } 20 | 6 | 100 | .00 |
| 30 } 40 | 5 | 83 | .08 |
| 50 } 60 | 4 | 67 | .17 |
| 70 } 80 | 3 | 50 | .30 |
| Shadow: 90 | 2 | 33 | .48 |

[1] Percent dot is an indication of the area covered by ink during printing.

Once the above data are determined, a photographic film can be exposed and processed to yield a masking layer having the density range shown in the last column of the above table. The correct density range is determined from a standard neutral density table showing percent transmission, and the negative material and processing conditions required are obtained from a series of characteristic curves for specific photographic emulsions. The mask may be exposed in several ways, e.g., by making a positive of the halftone negative through a diffusing film, or by using a diffuse light source. Suitable diffusing films include the flexible translucent coated film described in assignee's Van Stappen application Ser. No. 774,822 filed Nov. 19, 1958, now U.S. Patent 2,964,423, issued Dec. 13, 1960, translucent plastic sheets, e.g., opalized polyvinyl acetate, and grained plastic sheets, e.g., polymethylmethacrylate, polyvinyl acetate, cellulose acetate, etc. and such films containing pigment additives. The diffuse light source is used in conjunction with a clear separator. In either case, diffusion is sufficient to blend dots together to produce a continuous tone image on the positive. The resulting exposed film is developed to the required density range as determined by the above table. The photopolymerizable element is then exposed through the halftone negative and masking layer held in register. Upon processing the photopolymerized element by washing away or otherwise removing the unpolymerized material as described in the aforementioned patents, a printing plate is obtained which, when used in the normal manner in a printing press, gives excellent reproductions of the original image and text matter. Detail is not lost in the shadow areas of halftones due to plate wear or because of ink filling in the well areas between the reliefs. The heavy line dimensions are maintained and show little tendency to increase in size with plate wear. At the same time fine lines and highlight dots have not been lost.

The invention will now be illustrated by, but is not limited to the following examples.

EXAMPLE I

A good halftone negative was made from copy having a density range shown in the table below. A photopolymerizable element having a photopolymerizable layer, 40 mils thick, prepared from a mixture of cellulose acetate succinate, triethylene glycol diacrylate, anthraquinone and triethylamine was made according to Example 3 of Burg U.S. application Ser. No. 750,868, filed July 25, 1958 now U.S. Patent 3,036,913. The element was exposed through a photographic negative for eight minutes to give a dot depth throughout the tonal range in the element as shown in the table below. It will be seen that the dot or relief depth in the shadow regions or areas of greatest density in the copy is only 0.25 mil while in the highlights the relief depth is 5.0 mils. A photographic masking layer was then made by making a series of test exposures as described above, only using 8 minutes as the time necessary to adequately polymerize the highlight dots. It was found that 2 minutes was adequate for polymerizing the shadow dots in a manner to give adequate dot depth. Using the two limits and reading from a standard nuetral density table showing percent transmission, it was found at two minutes or 25% of the equivalent exposure, a density range of about 0.60 is required. A mask was made by exposing a medium-contrast film having a non-optically-sensitized gelatino silver iodobromide emulsion coated thereon to the halftone negative. The exposure was made by arranging the halftone negative and film with a diffusing film separator, as described in Example II of Assignee's Van Stappen application Ser. No. 774,822, filed Nov. 19, 1958 now U.S. Patent 2,964,423, issued Dec. 13, 1960, between them, and the printing light was positioned about six feet from the combined films. The medium-contrast film was so exposed and developed in a developer prepared from the following materials to give a density range of from 0.09 to 0.64.

| | |
|---|---|
| Water, liter | 1 |
| Sodium sulfite (anhy.), grams | 120.0 |
| Paraformaldehyde, grams | 30.0 |
| Potassium metabisulfite, grams | 150.0 |
| Boric acid, crystals, grams | 30.0 |
| Hydroquinone, grams | 90.0 |
| Potassium bromide, grams | 6.0 |
| Water to make, liters | 3.0 |

The film was fixed for two minutes in a fixing bath prepared from the following materials:

| | |
|---|---|
| Water, ml. | 600.0 |
| Sodium thiosulfate (anhy.), grams | 150.0 |
| Sodium sulfite, grams | 18.0 |
| Potassium alum, grams | 20.0 |
| Acetic acid (glacial), grams | 12.0 |
| Water to make, liter | 1.0 |

After drying the mask in the usual manner, it was placed in register with the halftone negative and a second photopolymerizable element as described above was exposed therethrough to give a dot depth in its tonal range of that shown in the following table. The overall exposure had to be increased 25% over that without the mask to compensate for the neutral density of the mask.

| | Shadows | Middletones | | | | | | Highlights | | |
|---|---|---|---|---|---|---|---|---|---|---|
| Copy density | 1.86 | 1.60 | 1.38 | 1.14 | 0.90 | 0.66 | 0.44 | 0.30 | 0.10 | 0.00 |
| Percent dot | 90 | 88 | 85 | 79 | 67 | 50 | 37 | 26 | 9 | 5 |
| Dot depth with mask | 1.20 | 1.15 | 1.25 | 1.45 | 1.75 | 1.85 | 2.5 | 3.1 | 4.0 | 4.9 |
| Density of mask | .64 | .61 | .60 | .58 | .54 | .48 | .37 | .27 | .18 | .09 |
| Dot depth without mask | 0.25 | 0.50 | 0.80 | 0.90 | 1.10 | 1.20 | 1.60 | 2.50 | 3.50 | 5.00 |

It will be seen that the dot depth in the extreme end of the shadow areas of the plate and in the middletone areas of the photorelief element have increased from 0.25 and 1.10 to 1.20 and 1.75 mils respectively. The resulting printing relief, when locked in a printing press, gave higher quality ink reproductions of the original because of the improved relief in the halftone shadow and middletone areas. The plate showed long wear life and was used to make high quality duplicating plates.

EXAMPLE II

Example I was repeated using a halftone negative as dscribed above which was taken from the same copy as in Example I. A photopolymerized plate was made by exposing it for 12 minutes to the negative to give a dot depth throughout the tonal range in the relief plate as shown in the table below. It will be seen that the dot or relief depth in the shadow region was only 0.9 mil at the extreme end while in the highlights the relief depth is 6.6 mils. A mask was then made by exposing the medium-contrast film in direct contact with the halftone negative to a radiation source through the diffusing film described in Example I. Twelve minutes was found to be necessary to adequately polymerize the highlight dots. It was found that 3 minutes was adequate for polymerizing the shadow dots in a manner to give adequate dot depth. Using the two limits and reading from a standard neutral density table showing percent transmission, it was found that at 3½ minutes or about 29% of the equivalent exposure, a density of about .54 is required. A mask was made by exposing the medium-contrast film described in Example I in contact with the halftone negative with a diffuse radiation source. The exposed film was deveolped to give a density range of from 0.10 to 0.60 using the developer of Example I. A photopolymerizable element was exposed to the combination of the halftone negative and positive mask in register and gave a dot depth in its tonal range as shown in the following table.

| | Shadows | Middletones | | | | Highlights | |
|---|---|---|---|---|---|---|---|
| Copy density | 1.86 | 1.60 | 1.14 | 0.66 | 0.44 | 0.30 | 0.10 |
| Percent dot | 84 | 79 | 70 | 50 | 26 | 12 | 3 |
| Dot depth with mask | 1.4 | 2.0 | 2.5 | 2.7 | 3.4 | 4.3 | 6.7 |
| Density of mask | .60 | .54 | .50 | .37 | .27 | .18 | .10 |
| Dot depth without mask | 0.90 | 1.5 | 1.9 | 2.2 | 3.0 | 4.3 | 6.6 |

The printing relief obtained was comparable to that of Example I having excellent relief images in halftone, shadow and middletone areas.

EXAMPLE III

Example I was repeated except that in place of the medium-contrast film, a high-contrast, ortho-sensitized lithographic type film was exposed to the halftone negative. The resulting exposed film was processed as described in Example I to give a positive mask which had a density range of from 0.08 to 0.58. Upon exposing a photopolymerizable element utilizing the negative and mask in register, a printing plate having the dot depth measurement shown in the following table was obtained.

| | Shadows | Middletones | | | | Highlights | |
|---|---|---|---|---|---|---|---|
| Copy density | 1.86 | 1.60 | 1.14 | 0.66 | 0.44 | 0.30 | 0.10 |
| Percent dot | 84 | 79 | 70 | 50 | 26 | 12 | 3 |
| Dot depth with mask | 1.4 | 2.0 | 2.4 | 2.9 | 3.2 | 4.2 | 7.1 |
| Density of the mask | .58 | .51 | .35 | .17 | .08 | .08 | 0.8 |
| Dot depth without mask | 0.9 | 1.5 | 1.9 | 2.2 | 3.0 | 4.3 | 6.6 |

As in Example I and II improved reproducibility was obtained with plates masked in the above manner.

The masks may be made from different negatives. For example, a continuous tone negative may be made at the same time as the halftone negative is made. The positive mask is then prepared by contact printing the continuous tone negative on to a medium-contrast film such as is described in Example I. This obviates the necessity of using a diffuse radiation source or a diffusing film or glass plate between the radiation source and the halftone negative or between the negative and the positive being exposed.

The novel method of controlling exposure is particularly useful for masking photopolymerizable elements described in the patents noted above. The photopolymerizable layers are generally prepared from a preformed polymer, e.g., cellulose acetate succinate, a non-gaseous ethylenically unsaturated compound having at least one and preferably 1 to 4 terminal unsaturated groups, a molecular weight of less than 1500 and a boiling point at normal atmospheric conditions of greater than 100° C., e.g., triethylene or polyethylene glycol diacrylate, a photoinitiator such as benzoin or benzoin methyl ether which are inactive thermally below 85° C. or preferably an anthraquinone initiator such as is described in Assignee's Notley application Ser. No. 659,772, filed May 17, 1957, now U.S. Patent 2,951,758, issued Sept. 6, 1960, and preferably 0.001 to 6.0% by weight of said layer of a thermal polymerization inhibitor, e.g., p-methoxyphenol. The layers are bonded to a sheet of metal, e.g., aluminum, or plastic, which may be coated with a non-halation layer or a light-absorptive stratum such that less than 35% of the incident light is reflected. The element is then exposed to a source of actinic radiation through an image-bearing negative and the masking layer in register and in intimate contact with the element surface. Suitable radiation sources include carbon arcs, mercury vapor arcs, fluorescent lamps with special ultraviolet radiation emitting phosphors, xenon arc lamps and photographic flood lamps.

In addition to being used to mask photopolymerizable elements during exposure, the method may be used to expose other types of photorelief elements which depend on polymerization or insolubilization in depth by actinic radiation.

This invention has the advantage that by use of the photographic masking layer the photopolymerized relief images in all text areas, including highlight, fine detail, middletone, shadow and bold stroke text areas, are formed throughout the thickness of the photopolymerized layer. All text areas have optimum printing structures as a result of adjusting, by means of the masking layer, the amount of actinic radiaiton received by a particular area. Another advantage is that all relief image areas, and in particular the fine detail areas, are not affected or lost during washout. An additional advantage is that the masking layer makes it possible to handle some types of copy not otherwise suitable for the preparation of photopolymerizable elements. A specific advantage is that the process extends the range of tone values that can be differentiated in printing into the deeper shadow areas than can normally be obtained from conventional relief printing plates. Still other advantages will be apparent to those skilled in the art.

What is claimed is:

1. A process for preparing a photopolymerized printing relief having improved uniformity of polymerization in shadow and highlight areas, said relief prepared from a photopolymerizable element comprising a support bearing a layer of a photopolymerizable composition comprising (1) a preformed compatible polymer binding agent, (2) a non-gaseous, addition-polymerizable ethylenically unsaturated compound containing at least one terminal ethylenic group capable of forming a high polymer by photo-initiated addition polymerization in the presence of an addition polymerization initiator therefor activatable by actinic radiation and (3) from 0.0001 to 10 percent by weight, of the layer of such an initiator which is inactive thermally below 85° C., which element requires a first amount of exposure to actinic radiation to obtain a suitable depth of polymerization in highlight areas and a second, substantially lesser amount of exposure to obtain a suitable depth of polymerization in shadow areas; which process comprises directing actinic radiation in an amount at least equal to said first amount of exposure at said element through a halftone negative having highlight and shadow areas, said negative having in register therewith a masking layer having complementary areas to said negative highlight and shadow areas, the densities of said complementary areas being modulated such that the masking area complementary to said negative highlight area is essentially clear and transparent to allow said first amount of exposure and the masking area complementary to said negative shadow area having increased density to allow said second amount of exposure.

2. A process as defined in claim 1 wherein said negative contains highlight, middletone and shadow image areas and said photographic masking layer is a continuous tone positive of said negative and contains areas complementary to said highlight, middletone and shadow image areas and being essentially clear and transparent in the areas complementary to said highlight areas and having increasing density in the image areas ranging from those complementary to the highlight areas to those complementary to the shadow areas.

3. A process as defined in claim 1 wherein said photopolymerizable layer is 3 to 250 mils in thickness.

4. A process as defined in claim 1 wherein said photopolymerizable layer is 10 to 60 mils in thickness.

5. A process as defined in claim 1 wherein said photopolymerizable compositions comprise a cellulose ester as the polymeric binding agent and polyethylene glycol diacrylate as the ethylenically unsaturated compound.

6. A process as defined in claim 1 wherein the range in density of the photographic masking layer in the areas complementary to said highlight areas to the density of the masking layer in the areas complementary to said shadow area is 1.0.

7. A process as defined in claim 6 wherein the maximum density of the photographic masking layer in the areas complementary to said shadow areas is 1.3.

References Cited by the Examiner

UNITED STATES PATENTS

| | | | |
|---|---|---|---|
| 687,107 | 11/1901 | D'Asar | 96—35 |
| 1,677,965 | 7/1928 | Fruwirth | 96—44 |
| 2,407,211 | 9/1946 | Yule | 96—44 |
| 2,927,022 | 3/1960 | Martin et al. | 96—35 |
| 2,927,023 | 3/1960 | Martin | 96—35 |

FOREIGN PATENTS

| | | |
|---|---|---|
| 592,296 | 9/1947 | Great Britain. |
| 599,392 | 3/1948 | Great Britain. |

OTHER REFERENCES

Bulletin for the Graphic Arts, No. 5, Eastman Kodak Co., Rochester, New York, 1944, pages 3–5.

Neblette, Photography, Its Materials and Processes, 5th Ed., D. Van Nostrand Co., Inc., 1952, pages 361–363.

NORMAN G. TORCHIN, *Primary Examiner.*

PHILLIP E. MANGAN, HAROLD N. BURSTEIN, *Examiners.*